United States Patent
Stamper

(10) Patent No.: US 6,433,429 B1
(45) Date of Patent: Aug. 13, 2002

(54) COPPER CONDUCTIVE LINE WITH REDUNDANT LINER AND METHOD OF MAKING

(75) Inventor: Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/388,132

(22) Filed: Sep. 1, 1999

(51) Int. Cl.[7] .................... H01L 21/441; H01L 23/48; H01L 23/52; H01L 29/40
(52) U.S. Cl. .................... 257/751; 257/758; 257/700; 257/701; 257/734; 257/753; 257/759; 257/762; 257/767; 257/760; 257/654; 257/774; 438/627; 438/653; 438/637
(58) Field of Search .................... 257/734, 758, 257/701, 710, 751, 761–766, 750, 628, 638, 653, 654; 438/675, 633, 653, 627, 637, 685, 442, 396

(56) References Cited

U.S. PATENT DOCUMENTS

| | | | |
|---|---|---|---|
| 4,977,440 A | * 12/1990 | Stevens | |
| 4,985,750 A | 1/1991 | Hoshino | |
| 5,164,330 A | 11/1992 | Davis et al. | |
| 5,236,869 A | * 8/1993 | Takagi et al. | |
| 5,254,498 A | 10/1993 | Sumi | |
| 5,262,354 A | 11/1993 | Cote et al. | |
| 5,403,779 A | * 4/1995 | Joshi et al | |
| 5,449,947 A | * 9/1995 | Chen et al. | 257/530 |
| 5,470,789 A | 11/1995 | Misawa | |
| 5,585,673 A | 12/1996 | Joshi et al. | |
| 5,641,992 A | * 6/1997 | Lee et al. | 257/762 |
| 5,708,303 A | 1/1998 | Jeng | |
| 5,719,070 A | * 2/1998 | Cook et al. | |
| 5,723,387 A | 3/1998 | Chen | |
| 5,847,463 A | * 12/1998 | Trivedi et al. | 257/751 |
| 5,942,799 A | * 8/1999 | Danek et al. | 257/751 |
| 6,081,021 A | * 6/2000 | Gambino et al. | 257/529 |
| 6,130,156 A | * 10/2000 | Havemann et al. | 438/637 |
| 6,147,402 A | * 11/2000 | Joshi et al. | 257/751 |
| 6,169,010 B1 | * 1/2001 | Higashi | 438/396 |
| 6,204,186 B1 | * 3/2001 | Chaudhry et al. | 438/700 |
| 6,229,211 B1 | * 5/2001 | Kawanoue et al. | 257/751 |
| 6,346,745 B1 | * 2/2002 | Nogami et al. | 257/751 |
| 6,348,402 B1 | * 2/2002 | Kawanoue et al. | 438/618 |
| 6,348,731 B1 | * 2/2002 | Ashley et al. | 257/751 |
| 6,353,260 B2 | * 3/2002 | Liu et al. | 257/758 |

* cited by examiner

Primary Examiner—Alexander O. Williams
(74) Attorney, Agent, or Firm—DeLio & Peterson, LLC; John J. Tomaszewski; Howard J. Walter, Jr.

(57) ABSTRACT

Interconnections including copper conductor lines, vias and Damascene lines comprise an insulator or dielectric having openings therein, a first adhesion promoting conductive barrier liner material on the walls and base of the opening, a first conductive layer on the first adhesion material layer, the first conductive layer having a predetermined cross-sectional area and having electromigration resistance, a second adhesion promoting/conductive barrier layer on the first conductive layer and a soft low resistant metal such as copper filling the remainder of the opening forming the line or via. These interconnections have enhanced operating and electromigration life particularly if copper is missing or partially missing in the copper interconnections due to the copper deposition process.

18 Claims, 3 Drawing Sheets

US 6,433,429 B1

COPPER CONDUCTIVE LINE WITH REDUNDANT LINER AND METHOD OF MAKING

BACKGROUND OF THE INVENTION

1. Field of the Invention

This invention relates to electronic components such as semiconductor devices, multilayer ceramic structures and multilayer thin film structures having copper conductor lines and vias within the component and, more particularly, to lined copper conductor lines and vias having increased electromigration and operating lifetime.

2. Description of Related Art

Electronic components are used throughout industry and basically use metal conductor lines to form circuits in the component. It is essential that the metal conductor lines have a long life without failure by metal voiding in the line due to electromigration, stress voiding or missing copper defects. For convenience the following will be directed to copper conductor lines and vias in thin film multilayer structures having interconnected circuitry and will be applicable to all low resistance conductors including AL, Ag, Au, Cu, etc. and alloys thereof.

Multilayer electronic components offer an attractive packaging solution for high performance systems such as in computer, telecommunications, military and consumer applications. These electronic components offer high density interconnections and the ability to provide increased circuitry for a given electronic component size.

Multilayer thin film electronic components have evolved to the use of copper as the wiring material and polyimide as the dielectric or insulator. As this has evolved, damascene has become the wiring method of choice. Damascene construction refers to the depositing of an insulation or dielectric, etching a groove or trench to form the wiring structure, depositing barrier metals and copper over the insulation structure to fill the groove and then chemical-mechanical polishing the copper so it is coplanar with the dielectric.

An important aspect of multilayer electronic components is the via or openings between layers in which a conductive material is applied to provide electrical contact between the metallization on different layers. Broadly stated, the typical multilayer electronic component is built up from a number of layers of a dielectric material layer such as silicon oxide, fluorinated silicon oxide, polymers including polyimide and fluorinated polyimide, polyarylene ether, $SiC_xO_yH_2$, ceramics, carbon and other dielectric materials. In the processing sequence known in the art as the "Damascene Process", the dielectric layer is patterned using known techniques such as the use of a photoresist material which is exposed to define the wiring pattern. After developing, the photoresist acts as a mask through which a pattern of the dielectric material is removed by a subtractive etch process such as plasma etching or reactive ion etching. This is generally termed a lithography or photolithography process and may be used for both additive or subtractive metallization procedures as is known in the art. Using the Damascene Process, openings defining wiring patterns are provided in the dielectric layer, extending from one surface of the dielectric layer to the other surface of the dielectric layer. These wiring patterns are then filled with a thin PVD or CVD metal, such as a Ti or Ta based metal or nitridized metal. Next, a thin seed layer such as PVD or CVD copper is deposited followed by a thicker Cu deposition by electroplating, electroless plating, chemical vapor deposition, physical vapor deposition or a combination of methods. This process may include planarization of the metal by removing excess material with a method such as chemical mechanical polishing.

In the Single Damascene Process, vias or openings are provided in the dielectric layer and filled with metallization to provide electrical contact between layers of wiring levels. In the Dual Damascene Process, the via openings and the wiring pattern openings are both provided in the dielectric layer before filling with metallization. This process simplifies the procedure and eliminates some internal interfaces. These procedures are continued for each layer in the electronic component until the electronic component is completed.

In FIG. 3B, a typical dual Damascene line of the prior art is shown. Dielectric layers 11a and 11b having horizontal dielectric barrier layers 16 thereon are shown comprising metallization 12 in dielectric layer 11b and metallization 12a and stud 14 in dielectric layer 11a. The stud 14 and metallization 12a are shown encased by a conducting diffusion barrier liner 15. A single Damascene line structure of the prior art is shown in FIG. 2B.

The dielectric material provides electrical insulation and electrical isolation between the copper wiring elements. To avoid metal diffusion between the metal and the dielectric, conductive barrier layers, also referred to as liners, and dielectric barrier layers are included in the structure to contain the copper or other metal and to provide improved adhesion of the copper lines to the dielectric or other metallization.

The barrier layer typically consists of a single or combination of refractory metals from the family of Ti, W and Ta and nitrides such as TaN, WN and TiN and provides a barrier to the diffusion of copper metal between the metal line and the dielectric. Typically, the barrier layer is formed between the dielectric layers and in the line and via on both sidewalls and at the base thereof to form the barrier layer. It has been found however, that when lined copper conductor lines and/or vias (including single and dual Damascene lines) have areas of missing or partially missing copper due to inclusions from the plating process used to fabricate the lines, missing copper seed layer or voided copper due to electromigration stress voiding or defects, the current must be carried by the liner which can cause fails as noted above.

Bearing in mind the problems and deficiencies of the prior art, it is therefore an object of the present invention to provide electronic components having copper conductor lines and vias with increased operating and electromigration life including multilayer electronic components having Damascene lines made using a single Damascene process or a dual Damascene process.

It is another object of the present invention to provide a method for making copper conductor lines and vias with increased operating and electromigration life including multilayer electronic components having Damascene lines made using a single Damascene process or a dual Damascene process.

Still other objects and advantages of the invention will in part be obvious and will in part be apparent from the specification.

SUMMARY OF THE INVENTION

The above and other objects, which will be apparent to one of skill in the art, are achieved in the present invention which relates in one aspect to a copper conductor metal line or via including Damascene metal lines having high electromigration resistance and operating life comprising:

an insulator or dielectric having an opening therein in the form of metal lines, vias and/or Damascene lines;

a first adhesion promoting conductive barrier layer liner material in the opening, e.g., on the walls and base of the opening;

a first conductive layer on the first adhesion promoting conductive barrier layer liner material layer having a predetermined cross-sectional area said first conductive layer having electromigration resistance;

a second adhesion promoting conductive barrier liner layer on the first conductive layer; and a soft low resistance central core of metal preferably copper forming the line or via. A multilayer electronic component having interconnected metallization including copper lines, vias and/or Damascene lines, the electronic component having high electromagnetic resistance and operating life comprising:

an insulator or dielectric having an opening therein in the form of metal lines, vias and/or Damascene lines;

a first adhesion promoting conductive barrier liner material layer in the opening, e.g., on the walls and base of the opening;

a first conductive layer on the first adhesion promoting conductive barrier layer liner material layer having a predetermined cross-sectional area said first conductive layer having electromigration resistance;

a second adhesion promoting conductive barrier liner layer on the first conductive layer; and a soft low resistance central core of metal preferably copper forming the line or via.

In a further aspect of the invention a method is provided for making a copper conductor line, via and/or Damascene line having high electromigration resistance and operating life comprising:

forming an insulator or dielectric on a substrate;

forming an opening in the form of metal lines, vias and/or Damascene lines in the insulator;

applying a first adhesion promoting conductive barrier liner material layer in the opening, e.g., on the walls and base of the opening;

applying a first conductive layer on the first adhesion promoting conductive barrier layer liner material layer, the first conductive layer having a predetermined cross-sectional area and having electromigration resistance;

forming a second adhesion promoting conductive barrier liner layer on the first conductive layer; and applying a soft low resistance metal preferably copper on the second adhesion promoting conductive barrier layer filling the opening forming the line or via.

A method is provided for making a multilayer electronic component having copper conductor lines, vias and/or Damascene metal lines with high electromigration resistance comprising:

forming the multilayer electronic component layer by layer with dielectric layers;

forming openings in the dielectric layer in the form of lines, vias and/or Damascene metal lines;

applying a first adhesion promoting conductive barrier layer liner material layer in the opening, e.g.,on the walls and base of the openings;

applying a first conductive layer on the first adhesion promoting conductive barrier layer liner material layer, the first conductive layer having a predetermined cross-sectional area and having electromigration resistance;

applying a second adhesion promoting conductor barrier liner layer on the first conductive layer; and applying a soft low resistance metal preferably copper filling the opening and forming the line or via.

Electronic components made using the method of the invention are also provided.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however both as to organization and method of operation, may best be understood by reference to the detailed description which follows taken in conjunction with the accompanying drawings in which:

DESCRIPTION OF THE PREFERRED EMBODIMENT(S)

Figure 1A:
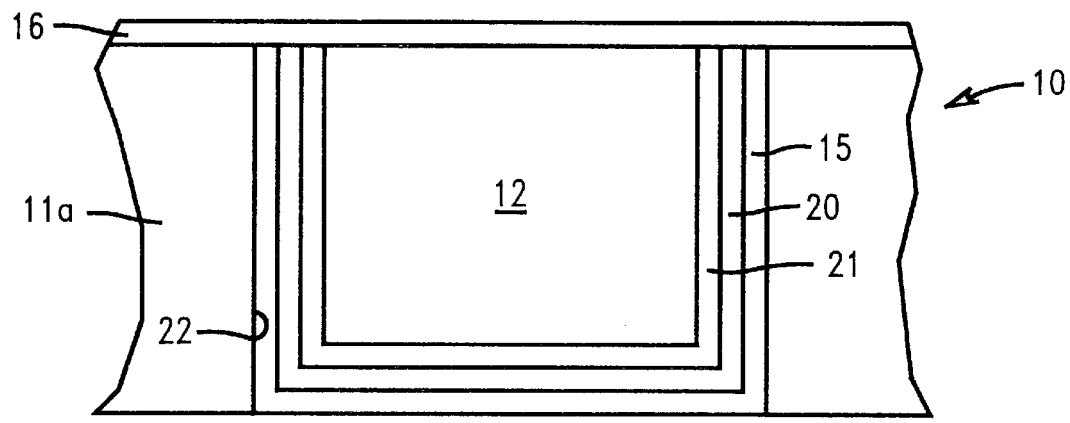
FIG. 1A is a cross-sectional view of a copper conductor line of the invention.

In describing the preferred embodiments of the present invention, reference will be made herein to FIGS. 1–3B of the drawings in which like numerals refer to like features of the invention. Features of the invention are not necessarily shown to scale in the drawings.

Figure 1B:
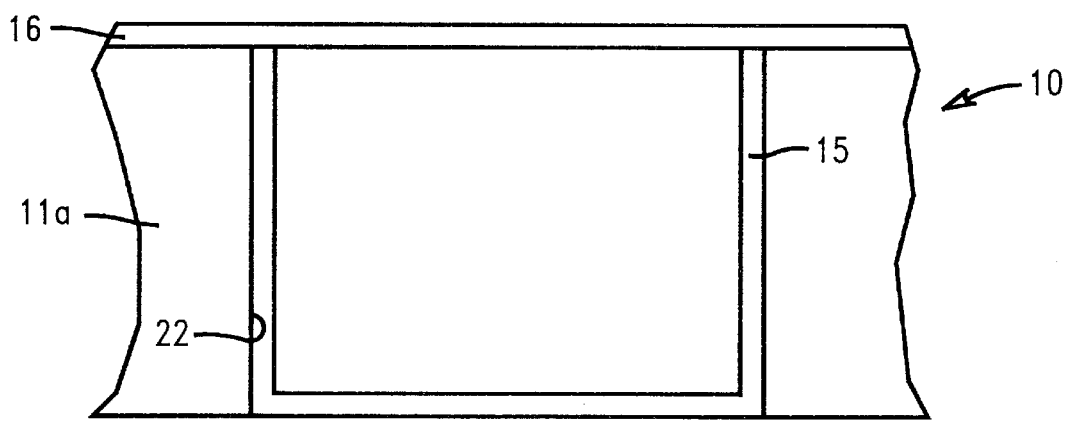
FIG. 1B is a cross-sectional view of a copper conductor line of the prior art.

Referring to FIGS. 1A and 1B, a copper conductor line of the invention (FIG. 1A) may be compared and contrasted with a copper conductor line of the prior art (1B). Thus, in FIG. 1A, an opening 22 in dielectric 11a carries a copper conductor line 12a. The opening has a first outer diffusion conductive barrier layer 15, an overlaying highly conductive electromigration resistant metal layer 20, a second diffusion conductive barrier layer 21 and a central copper core line 12a The barrier layers prevent the metal layer 20 from diffusing into layer 12a. The copper conductor line 12a is therefore enclosed on three sides by the sequential second barrier layer 21, highly conductive metal layer 20 and outer diffusion barrier layer 15. An optional dielectric horizontal barrier layer 16 such as $SiN_xH_y$ or $SiC_xH_y$ is shown on the upper surface of copper conductor line 12a.

Referring now to FIG. 1B which shows a copper conductor line of the prior art, the copper conductor line 12a is formed in an opening 22 in dielectric 11a and is surrounded by diffusion conductive barrier layer 15 and an upper horizontal diffusion barrier layer 16. Such a design as noted above may cause failures due to areas of missing or partially missing copper in copper conductor line 12a. The structure of the invention shown in FIG. 1A overcomes these problems because of the two adhesion conductive barrier layers 15 and 21 sandwiching a highly conductive metal layer 20 having good electromigration resistance properties such as Ag, Cu, Al, Au or alloys thereof such as CuIn, CuSn, AlCu, etc.

Figure 2A:
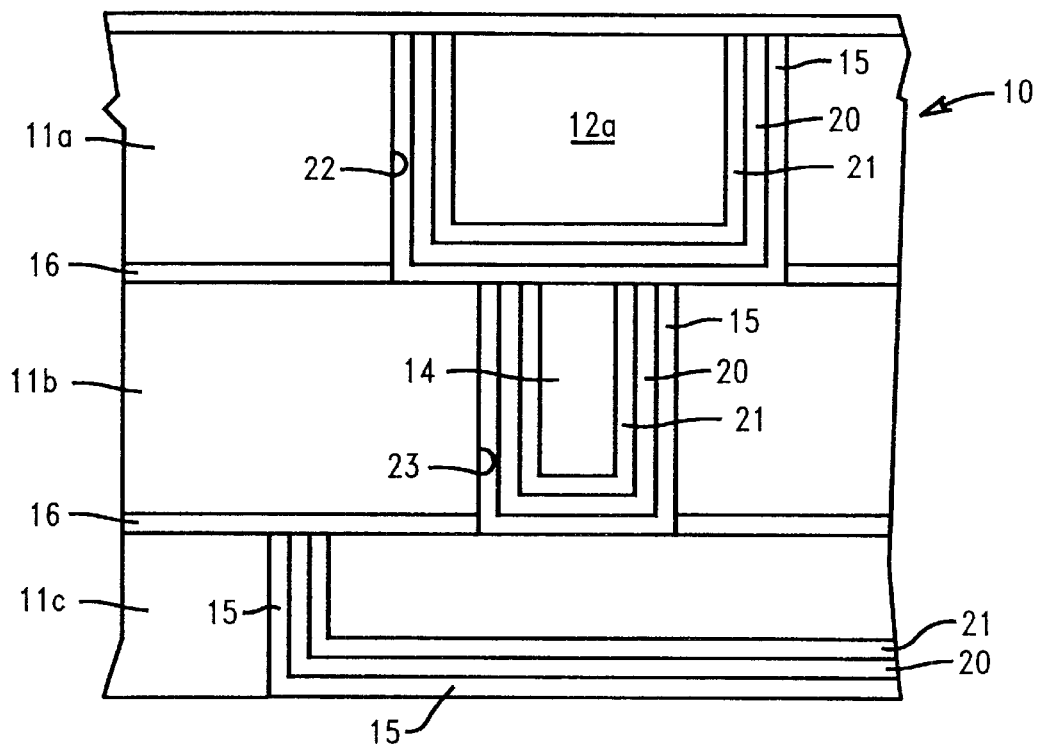
FIG. 2A shows a cross-sectional view of a multilayer electronic component having a single Damascene interconnecting line and stud (via) of the invention.

Referring to FIG. 2A, part of a multilayer electronic component 10 of the invention having a single Damascene interconnecting line and via is shown schematically in partial cross-section and comprises three (3) dielectric layers collectively shown as 11 and individually as 11a, 11b and 11c. The layers 11 may be made of any suitable dielectric material depending on the application for the electronic component, and includes materials such as silicon oxide, fluorinated oxide, a polymer such as polyimide, polyarylene ether, $SiC_xO_yH_7$, a diamond-like carbon or a spun on glass. The layers are shown having metallization therein in the form of wires or lines 12 and 12a and interconnecting via or stud 14. Stud 14 can be seen electrically connecting wire 12a to wire 12. Metallization layers 12, 12a and 14 are formed of conductors such as copper.

Layers 11a–11c are shown separated by horizontal dielectric barrier layers 16 which may or may not be the same and which prevent the diffusion of the copper metallization from one layer to the next layer. Layer 16 may additionally be a material which also acts as an etch-step when chemically etching the component. An adhesion/barrier conductive diffusion layer (liner) 15 is shown forming the outer walls and base of the openings 22 and 23 containing metallization 12a and stud 14, respectively. A high conductivity liner 20 such as Ag, Cu, Al, etc. is shown overlying the liner 15. Overlaying the high conductivity liner 20 is another conductive barrier liner shown as 21 (this liner is typically the same material as liner 15). The copper conductor line or core is shown as 12, 12a and 14.

The liners 15 and 21 may be any suitable material which provides a diffusion barrier between the wire and/or stud metallization and the dielectric. Preferred liner materials are the refractory metals such as tantalum, tantalum nitride, tungsten nitride, silicon nitride, tantalum silicon nitride, tungsten silicon nitride, titanium nitride and titanium silicon nitride, preferably tantalum containing materials. The thickness of the liners 15 and 21 is usually about 0.005 to 0.2 microns, e.g., 0.04 microns. The high conductivity metal liner 20 is a metal with good electromigration properties such as Ag, Cu, Al, Au, alloys thereof, CuIn, CuSn, AlCu, etc. The thickness of liner 20 may vary and is typically 0.005 to 0.2 microns, e.g., 0.04 microns.

Figure 2B:
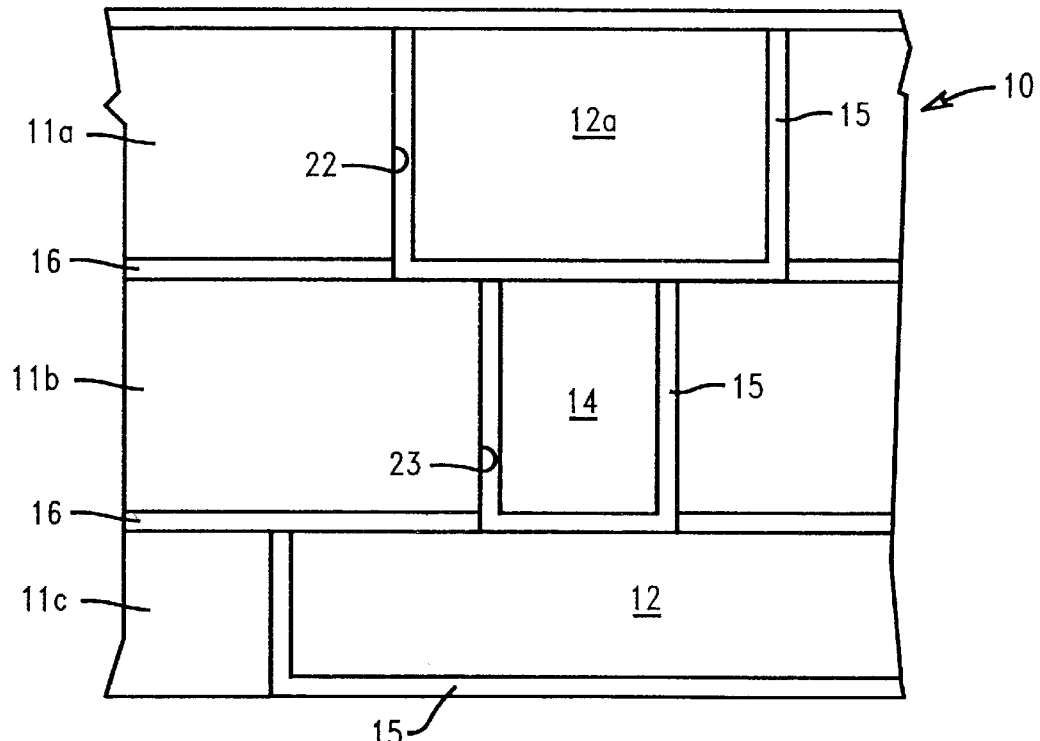
FIG. 2B shows a cross-sectional view of a multilayer electronic component having a single Damascene interconnecting line and stud (via) of the prior art.

FIG. 2B shows the same structure of FIG. 2A using only an adhesion/barrier layer 15.

Figure 3A:
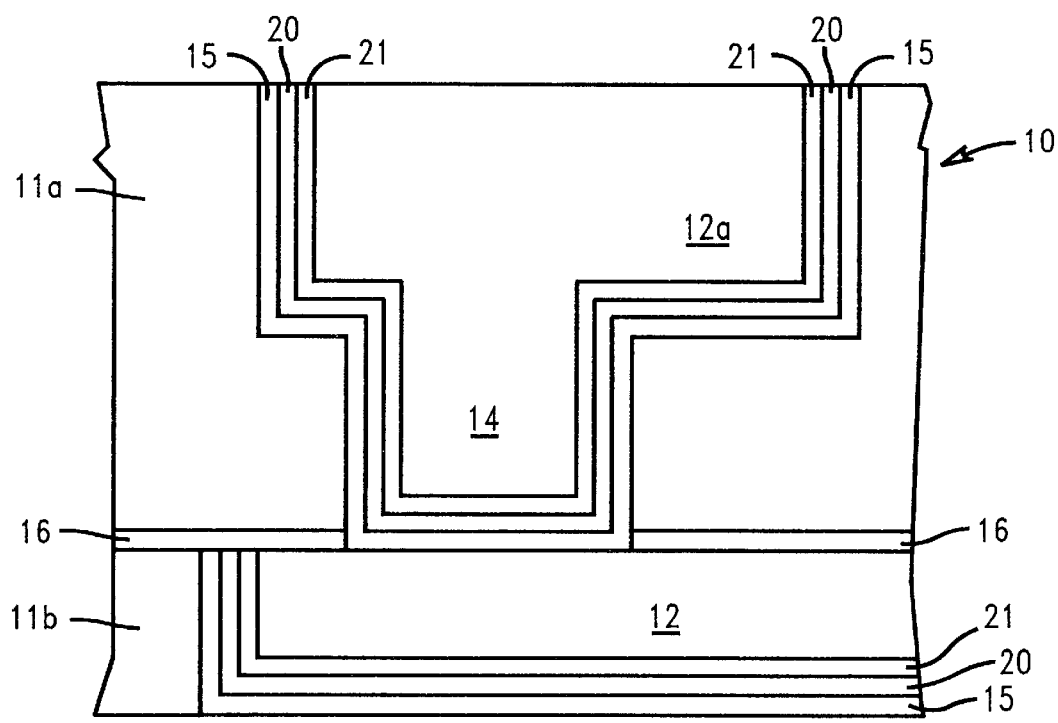
FIG. 3A shows a cross-sectional view of an electronically interconnected dual Damascene line containing multilayer electronic component of the invention.

In FIG. 3A, a dual Damascene structure is shown comprising insulator (dielectric) layers 11a and 11b having diffusion barrier layers 16 on the horizontal surfaces thereof Diffusion barrier layers 16 may also act as an etch stop when etching the opening in layer 11a for the dual Damascene line. A via 14 and trench 12a is formed in dielectric layer 11a and liner layer 15 is formed on the surface of via opening 14 and trench 12a. It is generally preferred that the liner material 15 be different from the horizontal diffusion barrier layers 16. High conductivity metal layers 20 is then applied to the liner layer 15 followed by another liner layer 21 on top of the layer 20. The copper is then plated in layered via 14 and trench opening 12a.

A copper seed layer is typically first applied over layer 21 using known techniques such as flash plating, physical vapor deposition, chemical vapor deposition or electroless plating. A copper layer is then electroplated filling trench 12a and via 14. Copper may also be deposited by chemical vapor deposition or physical vapor deposition. Alternatively, electroless plating can be used to form the metallization. In these cases a separate copper seed layer may not be needed.

The copper is then typically planarized to the surface of layer 11a using CMP forming the finished stud 14 and metallization 12a as shown in FIG. 3A.

Figure 3B:
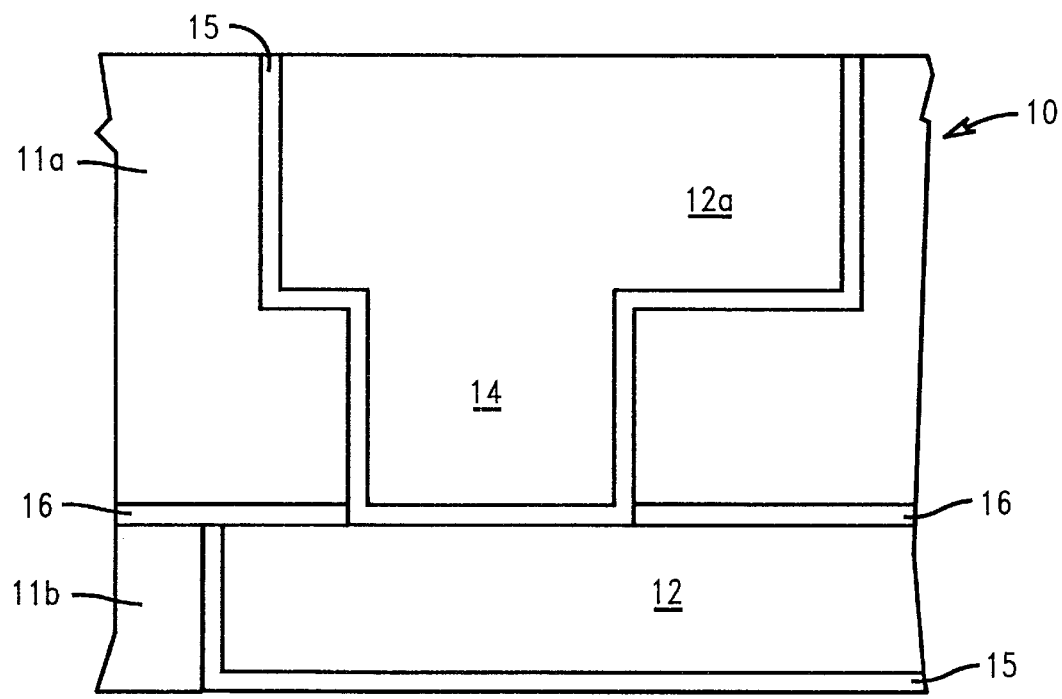
FIG. 3B shows a cross-sectional view of an electronically interconnected dual Damascene line containing multilayer electronic component of the prior art

Referring now to FIG. 3B and comparing the conventional prior art dual Damascene structure of FIG. 3B with FIG. 3A of the invention, a trench 12a and stud 14 are filled with copper within dielectric layer 11a. Barrier layers 16 are shown between dielectric layers 11a and 11b. A copper line 12 is shown electrically connected to stud 14. A diffusion conductive barrier layer 15 is shown lining the via 14 and trench 12a. As noted above, such a structure may fail if the copper conductor lines 12a and/or stud 14 have areas of missing or partially missing copper since the current of the line must then be carried by the liner which can cause fails. The prior art structure of 3B is therefore to be compared and contrasted to the structure of the invention shown in FIG. 3A which uses a highly conductive electromigration resistant metal liner 20 between the two conductive barrier layers 15 and 21.

While the present invention has been particularly described, in conjunction with a specific preferred embodiment, it is evident that many alternatives, modifications and variations will be apparent to those skilled in the art in light of the foregoing description It is therefore contemplated that the appended claims will embrace any such alternatives, modifications and variations as falling within the true scope and spirit of the present invention.

Thus, having described the invention, what is claimed is:

1. A copper conductor metal line or via including Damascene metal lines having high electromigration resistance and operating life comprising:
    an insulator or dielectric having an opening therein in the form of metal lines, vias and/or Damascene lines;
    a first adhesion promoting/conductive barrier layer liner material in the opening;
    a first metal or metal-metal alloy conductive electromigration resistant layer on the first adhesion promoting conductive barrier layer liner material layer;
    a second adhesion promoting/conductive barrier liner layer on the first metal or metal-metal alloy conductive electromigration resistant layer; and
    a soft low resistance central core of metal forming the line or via.

2. The copper conductor of claim 1 wherein the central core of metal is copper.

3. The copper conductor of claim 2 wherein the first and second adhesion promoting conductive barrier layer liners are tantalum, tungsten and nitrides thereof.

4. The copper conductor of claim 3 wherein the first metal or metal-metal alloy conductive electromigration resistant layer is Ag, Cu, Al, Al alloy thereof, CuIn, CuSn or AlCu.

5. A multilayer electronic component having interconnected metallization including copper lines, vias and/or Damascene lines, the electronic component comprising:
    an insulator or dielectric having openings therein in the form of metal lines or vias or Damascene lines;
    a first adhesion promoting/conductive barrier liner material layer in the openings;
    a first metal or metal-metal alloy conductive electromigration resistant layer on the first adhesion promoting conductive barrier layer liner material layer;
    a second adhesion promoting/conductive barrier liner layer on the first metal or metal-metal alloy conductive electromigration resistant layer; and a soft low resistance central core of metal forming the line or via.

6. The multilayer electronic component of claim 5 wherein the central core of metal is copper.

7. The copper conductor of claim 6 wherein the first and second adhesion promoting conductive barrier layer liners are tantalum, tungsten and nitrides thereof.

8. The copper conductor of claim 7 where the first metal or metal-metal alloy conductive electromigration resistant layer is Ag, Cu, Al, Al alloy thereof, CuIn, CuSn or AlCu.

9. A method for making a copper conductor line, via and/or Damascene line having high electromigration resistance comprising:

forming an insulator or dielectric on a substrate;

forming an opening in the form of metal lines, vias and/or Damascene lines in the insulator;

applying a first adhesion promoting/conductor barrier liner material layer in the opening;

applying a first metal or metal-metal alloy conductive electromigration resistant layer on the first adhesion promoting conductive barrier layer liner material layer;

forming a second adhesion promoting/conductive barrier liner layer on the first metal or metal-metal alloy conductive electromigration resistant layer; and applying a soft low resistance metal on the second adhesion promoting/barrier layer filling the opening forming the line or via.

10. The method of claim 9 wherein the soft low resistance metal is copper.

11. The method of claim 10 wherein the first and second adhesion promoting conductive barrier layer liners are tantalum, tungsten and nitrides thereof.

12. The method of claim 11 wherein the first metal or metal-metal alloy conductive electromigration resistant layer is Ag, Cu, Al, Al alloy thereof, CuIn, CuSn or AlCu.

13. A method for making a multilayer electronic component having copper conductor lines, vias and/or Damascene metal lines with high electromigration resistance comprising:

forming the multilayer electronic component layer by layer with dielectric layers;

forming openings in the dielectric layer in the form of lines, vias and/or Damascene metal lines;

applying a first adhesion promoting/conductive barrier layer liner material layer in the opening;

applying a first metal or metal-metal alloy conductive electromigration resistant layer on the first adhesion promoting conductive barrier layer liner material layer;

applying a second adhesion promoting/conductive barrier liner layer on the first metal or metal-metal alloy conductive layer; and applying a soft low resistant metal filling the opening and forming the line or via.

14. The method of claim 13 wherein the soft low resistance metal is copper.

15. The method of claim 14 wherein the first and second adhesion promoting conductive barrier layer liners are tantalum, tungsten and nitrides thereof.

16. The method of claim 15 wherein the first metal or metal-metal alloy conductive electromigration resistant layer is Ag, Cu, Al, Al alloy thereof, CuIn, CuSn or AlCu.

17. An electronic component made using the method of claim 9.

18. An electronic component made using the method of claim 13.

* * * * *